United States Patent
Tsushima et al.

(10) Patent No.: US 7,184,295 B2
(45) Date of Patent: Feb. 27, 2007

(54) MEMORY DEVICE

(75) Inventors: Tomohito Tsushima, Kanagawa (JP); Katsuhisa Aratani, Chiba (JP); Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 11/037,554

(22) Filed: Jan. 18, 2005

(65) Prior Publication Data

US 2005/0174840 A1 Aug. 11, 2005

(30) Foreign Application Priority Data

Jan. 20, 2004 (JP) ............... P2004-012288
Apr. 20, 2004 (JP) ............... P2004-124543

(51) Int. Cl.
*G11C 11/00* (2006.01)
(52) U.S. Cl. .................. 365/148; 365/189.01
(58) Field of Classification Search .......... 365/148, 365/189.01
See application file for complete search history.

(56) References Cited

U.S. PATENT DOCUMENTS

| | | | | |
|---|---|---|---|---|
| 5,689,458 | A * | 11/1997 | Kuriyama | 365/159 |
| 6,141,241 | A * | 10/2000 | Ovshinsky et al. | 365/163 |
| 6,961,277 | B2 * | 11/2005 | Moore et al. | 365/222 |
| 2003/0035314 | A1 | 2/2003 | Kozicki | |
| 2004/0026731 | A1 * | 2/2004 | Fournier et al. | 257/314 |
| 2004/0141363 | A1 * | 7/2004 | Ohtsuka et al. | 365/154 |
| 2005/0174854 | A1 | 8/2005 | Tsushima et al. | |
| 2005/0195634 | A1 * | 9/2005 | Ishida et al. | 365/148 |
| 2006/0228860 | A1 * | 10/2006 | Shinohara et al. | 438/257 |

FOREIGN PATENT DOCUMENTS

| | | |
|---|---|---|
| EP | 1426972 A2 | 6/2004 |
| EP | 1486985 A2 | 6/2004 |
| WO | WO 02/091385 A1 | 11/2002 |

OTHER PUBLICATIONS

Beck, A. et al.; "Reproducible Switching Effect in Thin Oxide Films for Memory Applications", Applied Physics Letters, AIP, American Institute of Physics, Melville NY, vol. 77, No. 1, Jul. 3, 2000; pp. 139-141, XP012025998.

* cited by examiner

*Primary Examiner*—Michael Tran
(74) *Attorney, Agent, or Firm*—Wolf, Greenfield & Sacks, P.C.

(57) ABSTRACT

A memory device is provided in which recording of multi-valued data can be performed at a high speed and the recording of multi-valued data can be performed with a drive circuit having comparatively simple configuration.

The memory device is formed of a memory cell including a memory element which stores information according to a state of electric resistance and a MIS transistor as a load connected in series to the memory element; and when an operation to change the memory cell from a state of high resistance value to a state of low resistance value is defined as writing and when an operation to change the memory cell from the state of low resistance value to the state of high resistance value is defined as erasing respectively, a resistance value of the memory element after writing is set to a plurality of different levels by controlling gate voltages VG1, VG2 and VG3, or the like, which are applied to the MIS transistor at the time of writing, so that different information is respectively assigned to each of the plurality of levels and to the state of high resistance value after erasing to store information of three values or more respectively into a memory element of each memory cell.

7 Claims, 6 Drawing Sheets

MEMORY DEVICE

BACKGROUND OF THE INVENTION

1. Field of the Invention

The present invention relates to a memory device in which a memory cell is formed using a memory element which stores information according to a state of electric resistance.

2. Description of the Related Art

Since a semiconductor nonvolatile memory such as a flash memory is small-sized and recorded data is maintained even after a power supply is turned off, it is widely used as a medium for recording a moving picture and audio.

With respect to a nonvolatile memory, further greater recording capacity and recording density have been in demand.

A nonvolatile memory having a structure capable of multi-value recording, specifically which can store data of 2 bits or more in one memory cell, has been proposed as a structure to obtain the above.

At this time, in a case where the data of 2 bits can be recorded, for example, a memory element constituting a memory cell can maintain four kinds of state.

A flash memory or a resistance change type memory in which information is recorded by a change in the resistance value of a memory element has been known as a memory in which the art of multi-value recording is obtained.

In the resistance change type memory, the recording of information is performed by applying a voltage pulse to the memory element, for example (refer to non-patent reference 1).

Then, the resistance value of the memory element is made to vary by changing the number of application of this voltage pulse to obtain the multi-value recording.

[Non-patent reference 1] "Novel Colossal Magnetoresistive Thin Film Nonvolatile Resistance Random Access memory (RRAM)" written by W. W. Zhuang et al., Technical Digest "International Electron Devices Meeting", year 2002, on page 193.

However, since a writing operation in the flash memory is performed by injecting in stages an electric charge into a terminal called a floating gate, considerably large amount of time is required compared with a case of performing 1-bit recording (single-value recording) when the flash memory is used to perform the multi-value recording.

Further, when the multi-value recording is also performed using the above described resistance change type memory, resistance change in stages to obtain the multi-value recording is controlled by the number of application of the voltage pulse to the terminal, and therefore it takes time as well and it is difficult to accelerate the operation speed.

When an information recording operation is performed with respect to a memory cell capable of performing the above described multi-value recording, it is necessary to input a plurality of bits and to perform the electric charge injection or to perform the number of pulse application corresponding to the plurality of input bits, and therefore it is desired to perform the recording operation (the electric charge injection or the number of pulse application) according to a relation between the plurality of input bits and the multi-value information to be recorded, using a circuit which is not complicated and is excellent in area efficiency.

Accordingly, it is desired to obtain the memory device in which the multi-value recording can be performed at a high speed and a drive circuit thereof has a simple circuit structure and is excellent in area efficiency.

In order to solve the above described problems, the present invention is to provide a memory device in which recording of multi-valued data can be performed at a high speed and the recording of multi-valued data is made possible using a drive circuit of comparatively simple configuration.

SUMMARY OF THE INVENTION

A memory device of the present invention includes a memory cell formed of a memory element which stores information according to a state of electric resistance and a circuit element as a load connected in series to the memory element, in which when an operation to change the memory element from a state of high resistance value to a state of low resistance value is defined as writing and an operation to change the memory element from the state of low resistance value to the state of high resistance value is defined as erasing, the resistance value of the memory element after writing is set to a plurality of different levels by controlling a voltage or current which is applied to the circuit element or the memory element at the time of writing; different information is assigned in the memory element to each of the plurality of levels in the state of low resistance value and to the state of high resistance value after erasing, respectively; and information of three values or more can be stored respectively into the memory element of each memory cell.

According to the structure of the memory device of the above described present invention, since the memory cell is formed such that the circuit element as the load is connected in series to the memory element, the resistance value of the memory element changes to perform the writing in the memory element when a voltage equal to or more than a writing threshold voltage of the memory element is applied between both ends of the memory cell; however the resistance value of the memory element after writing is set to a state (operating point) which is determined by both a current-voltage characteristic (I-V characteristic) of the memory element and a current-voltage characteristic (I-V characteristic) of the circuit element, and the resistance value does not change any more. Accordingly, the resistance value to be set of the memory element after writing can be altered by changing the magnitude of voltage or current which is applied to the circuit element or the memory element.

Further, according to the memory device of the present invention, the resistance value of the memory element after writing is set to the plurality of different levels by controlling the voltage or the current which is applied to the circuit element or the memory element at the time of writing; different information is assigned in the memory element to each of the plurality of levels (N kinds; $N \geq 2$) in the state of low resistance value and to the state of high resistance value after erasing, respectively; and information of three values or more can be stored respectively in the memory element of each memory cell; so that with respect to the memory element the resistance value after the recording of information can be controlled to be in total (N+1) kinds of state which are the plurality (N kinds) of levels in low resistance and the state of high resistance. Accordingly, information of (N+1) values or more, namely three values or more, can be stored in the memory element.

Thus, it becomes possible to perform what is called multi-value recording of three values or more, in which more than two values (data "0" and "1") normally stored can be in a memory element.

Accordingly, without changing the number of application of the voltage pulse to the both ends of the memory cell, the information of three values or more can be recorded in the memory element with a single voltage pulse application, for example, by controlling the voltage or the current which is applied to the circuit element or the memory element, and a control over the pulse width or pulse application of multiple time become not necessary.

Accordingly, the multi-value recording can be performed in a short period of time.

In the above described memory device of the present invention, a structure is also obtained, in which the circuit element connected in series to the memory element is composed of a MIS transistor T; an access to the memory element of each memory cell is controlled by this MIS transistor T; and a gate voltage applied to a gate of the MIS transistor T is controlled at the time of writing; so that the resistance value of the memory element after writing can be set to a plurality of different levels.

When the memory device is thus structured, an on-resistance of the MIS transistor can be changed by altering the gate voltage and the state of resistance value of the memory element after writing can be altered, so that the above described multi-value recording can be performed.

Further, since the MIS transistor also acts as an active element for access to perform a selection of memory cell, the multi-value information can be recorded without specifically adding another circuit element to the memory cell.

Further, in the above described memory device of the present invention, a structure is obtained, in which the memory cells are disposed in matrix shape; wiring (for example, a word line) is connected in common to gates of the memory cells disposed in the row direction; selection means (for example, a row decoder) is provided to select specific wiring from the wiring which is connected to each row of the memory cells; and a potential control circuit of the wiring is connected to the selection means, or the selection means may include the potential control circuit of the wiring.

When the memory device is thus structured, the multi-value recording can be performed by controlling the gate voltage of the MIS transistor in the memory cell with a simple configuration, because the potential control circuit of the wiring is connected to the selection means or the selection means includes (incorporates) the potential control circuit of the wiring.

In the above described memory device of the present invention, also a structure is obtained, in which the circuit element connected in series to the memory element is composed of the MIS transistor; access to the memory element of each memory cell is controlled by this MIS transistor; and also the voltage or the current which is applied to a source-drain of the MIS transistor or to the memory element at the time of writing is controlled; so that the resistance value of the memory element after writing is set to a plurality of different levels.

When the memory device is thus structured, a voltage (potential difference) applied to the both ends of the memory cell can be changed by altering the voltage or the current which is applied to the source-drain or to the memory element and the state of resistance value of the memory element after writing can be altered, so that the above described multi-value recording can be performed.

Further, since the MIS transistor also acts as the active element for access to perform the selection of memory cell, the multi-value information can be recorded without specifically adding another circuit to the memory cell.

Furthermore, in the above described memory device of the present invention, a structure can be obtained, in which the memory cell is disposed in matrix shape; selection means (for example, a bit decoder and a source decoder) are provided for selecting specific wiring from the wiring connected in common to the memory cells in the row direction or to the memory cells in the column direction (for example, a bit line and a source line); and the voltage or the current which is applied to the source-drain of the MIS transistor or to the memory element is controlled by altering a resistance value of a switching element or of a variable resistance element in the selection means.

When the memory device is thus structured, the voltage applied to the both ends of the memory cell or the current flowing through the memory cell can be controlled with a comparatively simple configuration by changing the resistance value of the switching element or of the variable resistance element in the selection means, which is provided normally in the selection means, to perform the multi-value recording.

Moreover, in the above described memory device of the present invention, also a structure is obtained, in which second selection means (for example, a row decoder) is provided to select specific second wiring from the second wiring (for example, the word line) connected in common to the above described gates of the memory cells in the row direction; and a second wiring potential control circuit is connected to the second selection means or the second selection means may include (incorporate) the potential control circuit of the second wiring.

When the memory device is thus structured, the gate voltage of the MIS transistor in the memory cell can be controlled with the simple configuration, because the second wiring potential control circuit is connected to the second selection means or the second selection means includes (incorporates) the second wiring potential control circuit. Then, the multi-value recording can be performed by controlling the voltage applied to the both ends of the memory cell or the current which flows in the memory cell and also by controlling the gate voltage of the MIS transistor in the memory cell.

According to the above described present invention, it is possible to perform the multi-value recording in a short period of time, and therefore the multi-value recording can be performed at a high speed.

Moreover, the multi-value recording can be performed with the simple configuration by using the circuit element such as the active element for selecting the memory cell, the potential control circuit for the wiring, the variable resistance element or the switching element, and the like.

Therefore, according to the present invention, it is possible to perform the multi-value recording at a high speed and the memory device which enables the multi-value recording with the drive circuit of comparatively simple configuration can be obtained.

DESCRIPTION OF THE PREFERRED EMBODIMENTS

Hereinafter, an embodiment of a memory device according to the present invention is explained. In the present invention, a resistance change type memory element is used as a memory cell constituting the memory device.

Figure 1:
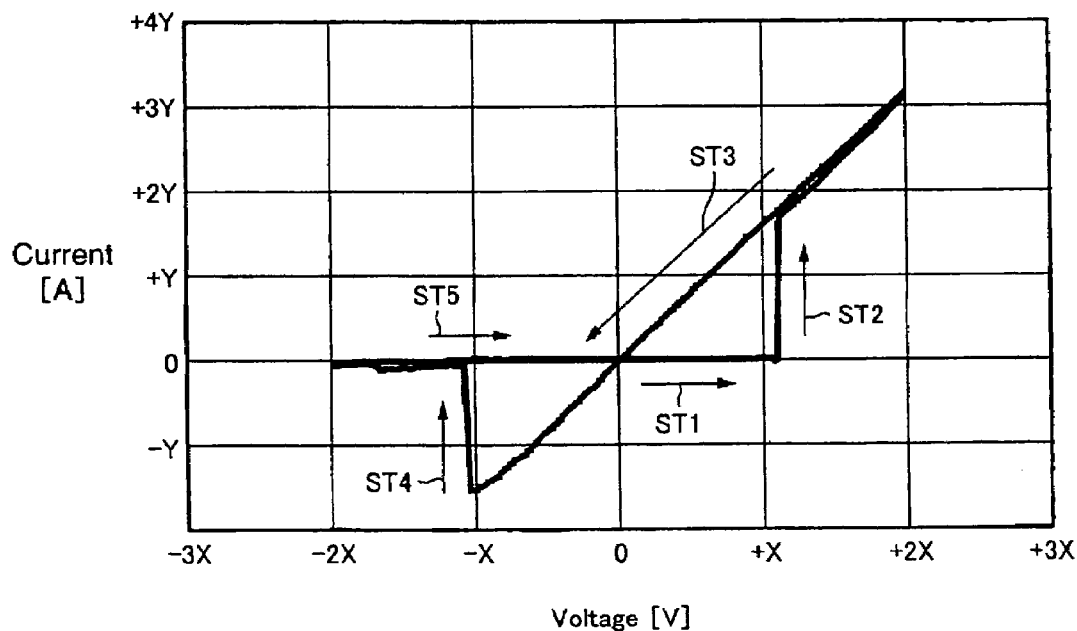
FIG. 1 is a diagram showing a voltage-current change of a resistance change type memory element used for a memory device in an embodiment of the memory device according to the present invention.

First, FIG. 1 shows a voltage-current change of the resistance change type memory element which is used in the memory device of an embodiment of the memory device according to the present invention.

Specifically, this resistance change type memory element is in a state where current can not flow easily because a resistance value in an initial state is large (ST1); however, when a voltage equal to or more than a writing threshold voltage (+1.1X [V] of FIG. 1, several hundreds mV, for example) is applied, the current flows and the resistance value falls (ST2).

Then, the memory element changes to have an Ohmic characteristic (ST3) and enters a state where the current flows in proportion to the voltage.

After that, even if the voltage is returned to zero volt, the resistance value thereof (low resistance value) is maintained.

Then, when a negative voltage is applied to the memory device and the applied voltage is gradually increased, the current decreases at an erasure threshold voltage (−1.1X [V] of FIG. 1, several hundreds mV, for example) (ST4) to change into the same high resistance as that of the initial state.

After that, even if the voltage is returned to zero volt, the resistance value thereof (high resistance value) is maintained (ST5).

Note that, although the range of applied voltage is set from −2X to +2X in FIG. 1, almost no change in resistance value is observed in this memory device even if the applied voltage is made larger than that.

Since this resistance change type memory element has the above described voltage-current characteristic, similarly to a conventional resistance change type memory element, a nonvolatile memory in which 1-bit information is recorded can be obtained. This resistance change type memory element is capable of alone constituting a memory cell C of the memory device.

As the resistance change type memory element which has the I-V characteristic as shown in FIG. 1, there can be listed a memory element in which a memory layer is interposed between a first electrode and a second electrode (for example, between a lower electrode and an upper electrode) for example, and the memory layer is made of an amorphous thin film such as a rare-earth oxide film, for example.

In case of the memory element of this structure, it is desirable that a metal such as Cu, Ag, or Zn which is easily ionized is contained in the rare-earth oxide film.

In this embodiment, an MIS transistor is particularly used as an active element for controlling an access to this memory element with respect to this resistance change type memory element. Further, as shown in a circuit diagram of FIG. 2, the MIS transistor T is connected in series to a resistance change type memory element A to form the memory cell C of the memory device. As a result, the MIS transistor T also acts as a load with respect to the resistance change type memory element A.

Figure 2:
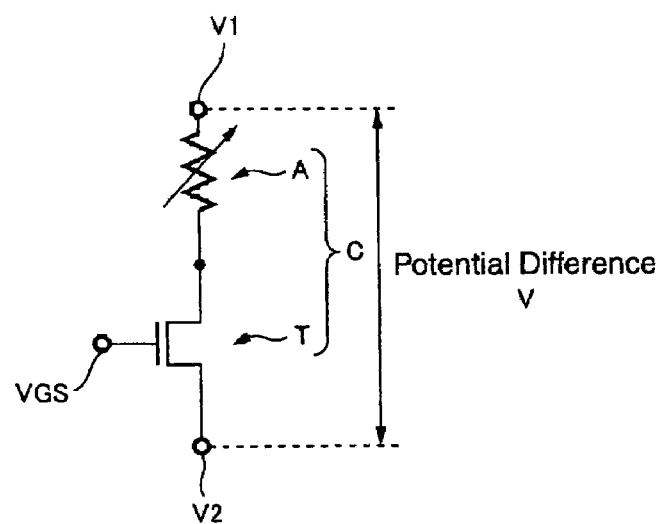
FIG. 2 is a circuit diagram of a memory cell formed of the resistance change type memory element in an embodiment of the memory device according to the present invention.

Specifically, as shown in FIG. 2, a terminal voltage V1 is applied to a terminal of the resistance change type memory element A on the opposite side to a terminal connected to the MIS transistor T; a terminal voltage V2 is applied to a terminal (for example, on the source side) of the MIS transistor T on the opposite side to the terminal connected to the resistance change type memory element A; and a gate voltage $V_{GS}$ is applied to a gate of the MIS transistor T.

Then, a potential difference V (=|V2−V1|) is generated between the both terminals by applying the terminal voltages V1 and V2 respectively to the both ends of the resistance change type memory element A and the MIS transistor T which constitute the memory cell C.

In addition, it is desirable that an on-resistance value of the MIS transistor T is lower than the high resistance value of the resistance change type memory element A. It is more desirable that the on-resistance value of the MIS transistor T is less than a fraction of the high resistance value of the resistance change type memory element A, for example, to be sufficiently low.

This is due to the reason that when the on-resistance value of the MIS transistor T is high, the potential difference applied between the terminals is mostly applied to the MIS transistor T and a loss of electric power occurs, so that the applied voltage may not be used efficiently for the change of resistance in the memory element A.

Figure 3:
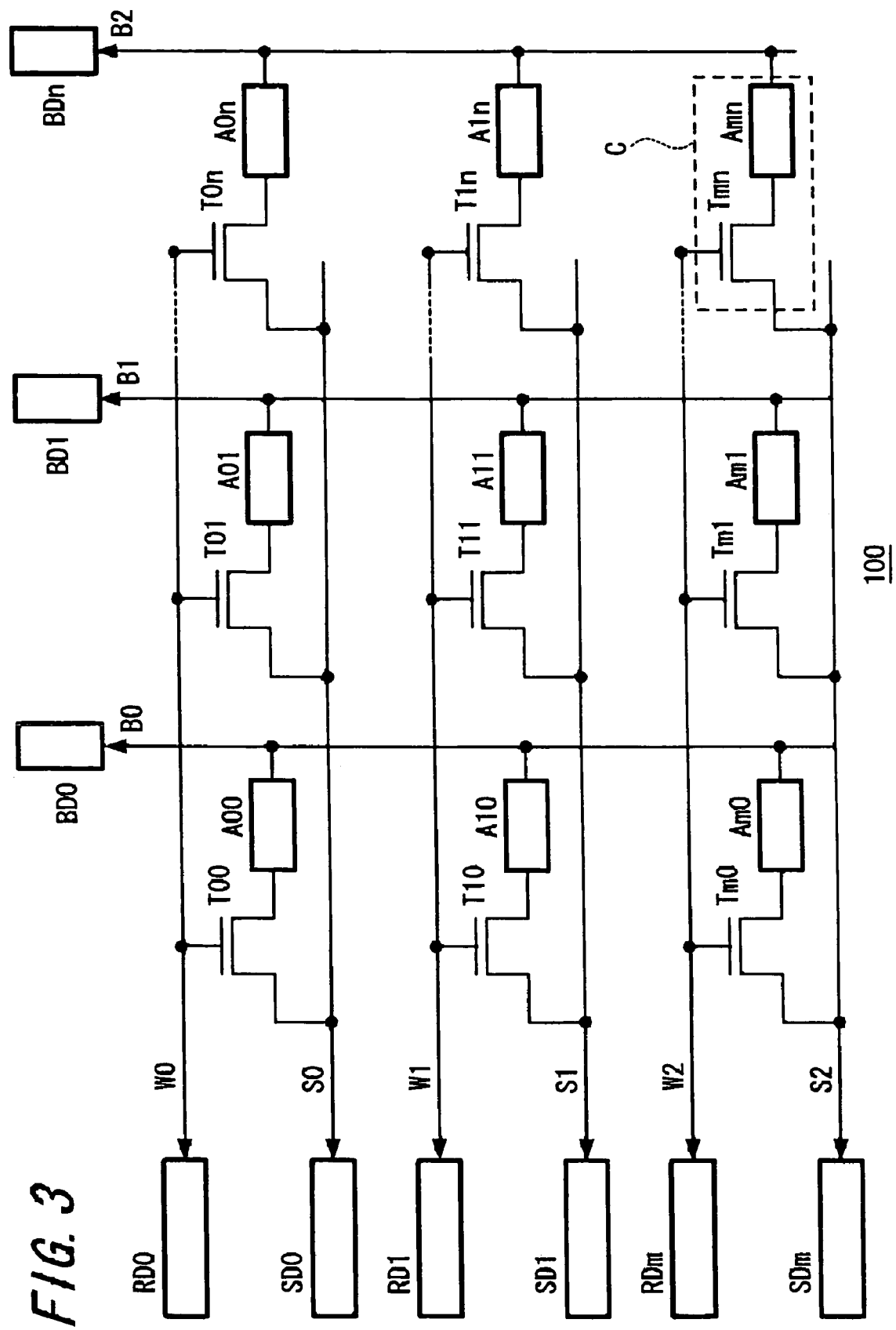
FIG. 3 is an electric circuit diagram in an embodiment of the memory device according to the present invention.

Next, an electric circuit diagram of the memory device according to this embodiment is shown in FIG. 3. This electric circuit diagram includes a voltage control circuit to apply each of the voltages (V1, V2 and $V_{GS}$) shown in FIG. 2.

A memory device 100 is formed of the memory cells C of (m+1) columns and (n+1) rows disposed in matrix shape. The memory cell C has a structure in which one end of the resistance change type memory element A is connected to one end of the transistor T (here, a drain) as shown in FIG. 2.

The gate of the transistor T (T00 through Tmn) is connected to a word line W (W0 through Wm). The other end of the resistance change type memory element A is connected to a bit line B (B0 through Bn). Further, the other end (source) of the transistor T is connected to a source line S(S0 through Sm).

Furthermore, the bit line B (B0 through Bn) is connected to a bit decoder BD (BD0 through BDn) which is the voltage control circuit thereof. The word line W (W0 through Wm) is connected to a row decoder RD (RD0 through RDm) which is the voltage control circuit thereof. The source line S(S0 through Sm) is connected to a source decoder SD (SD0 through SDm) which is the voltage control circuit thereof.

In the memory device 100 of this embodiment thus structured, information recording can be performed in the following manner, for example.

The gate voltage $V_{GS}$ is applied by the row decoder RD to the word line W corresponding to the memory cell C on which the recording of information should be performed to turn on the gate of the MIS transistor T. Further, the terminal voltages V1 and V2 shown in FIG. 2 are applied by the bit decoder BD and the source decoder SD respectively to the bit line B and the source line S corresponding to the memory cell C. Accordingly, the voltage V can be applied to the resistance change type memory element A and the MIS transistor T in the memory cell C.

When the voltage V is thus applied, if the voltage applied between the both ends of the resistance change type memory element A is larger than the above described writing threshold voltage of the resistance change type memory element A, the resistance value of the resistance change type memory element A falls from the state of high resistance and makes a transition to the state of low resistance.

Accordingly, the recording (hereinafter, referred to as writing) of information can be performed on the resistance change type memory element A.

Further, when the resistance value of the resistance change type memory element A is in the state of low resistance, and when the gate of the MIS transistor T is turned on and the voltage V having a reverse polarity to that of writing is applied to the resistance change type memory element A and the MIS transistor T in the memory cell C, if the voltage applied between the both ends of the resistance change type memory element A is larger than the above described erasure threshold voltage of the resistance change type memory element A, the resistance value of the resistance change type memory element A increases from the state of low resistance to make a transition to the state of high resistance.

Accordingly, the recording (hereinafter, referred to as erasing) of information can be performed on the resistance change type memory element A.

In addition, since the word line W is shared with the memory cells C of each row, the gates of the MIS transistors T are turned on in all memory cells C of the same row at this time.

Therefore, in case of performing the recording of information on, for example, only part of memory cells C, with respect to other memory cells C on which the recording of information is not performed among memory cells C of the same row, the potential of the bit line B is set to be the same as the potential of the source line S or is set so that a potential difference from the source line S becomes sufficiently smaller than the threshold voltage (writing threshold voltage or erasure threshold voltage) of the resistance change type memory element A, and the recording is not performed thereon.

Next, an explanation is schematically made with respect to the change when the voltage is applied to the both ends of the memory cell C.

The voltage V applied to the both ends of the memory cell C is divided and applied to the memory element A and the MIS transistor T.

At that time, if the on-resistance value of the MIS transistor T is sufficiently lower than the high resistance value of the memory element A as described above, almost all the applied voltage is applied to the both ends of the memory element A in the state where the resistance value of the memory element A is high. Specifically, with respect to the voltage VA applied to the both ends of the memory element A, VA=V is almost obtained.

Hereupon, when the applied voltage V is larger than a threshold voltage Vth of the memory element A (V>Vth), a recording operation is started and a resistance value R1 of the memory element A starts to fall. The voltage VA between the both ends of the memory element A also decreases along with the fall of the resistance value R1 of the memory element A.

Then, when the voltage VA between the both ends of the memory element A decreases to a certain voltage Vmin ($\geq$Vth), the decrease of the resistance value R1 of the memory element A stops and the resistance value R1 does not decrease any more. Accordingly, the voltage VA between the both ends of the memory element A also stops at the Vmin.

This is due to a reason that: when the voltage VA between the both ends of the memory element A decreases by the fall of the resistance value R1 of the memory element A, a relation between an current I which flows in the memory element A and the voltage VA between the both ends of the memory element A comes closer to the I-V characteristic of the memory element A; and when reached the I-V characteristic of the memory element A, no change is possible. In other words, in order to further decrease the resistance value R1 of the memory element A after reaching the I-V characteristic of the memory element A, this time the voltage VA between the both ends of the memory element A needs to increase; however, if this voltage VA is increased, the current I which flows in the memory element A also increases, and since the same current I also flows in the MIS transistor T connected in series to the memory element A, the voltage (V-VA) applied between the both ends of the MIS transistor T also increases correspondingly to the increase of the current I. However, since the voltage V applied to the memory cell C is constant and the voltages (VA, V-VA) which are respectively applied between the both ends of each of the elements A and T are obtained by dividing the applied voltage V, it is impossible to increase the both simultaneously.

Accordingly, the fall of the resistance value R1 of the memory element A stops in the state of having reached the I-V characteristic of the memory element A, and the voltages (VA, V-VA) which are applied between the both ends of each of the elements A and T become the constant values, respectively.

Hereinafter, this state is referred to as an operating point of this memory cell C. In the memory cell C of the memory device 100 according to this embodiment, the recording operation (writing operation) of information stops at this operating point.

The voltage between the both ends of each of the elements A and T and the current which flows in the memory cell C at this operating point can be obtained from the I-V characteristic of the memory element A and the I-V characteristic of the MIS transistor T. Specifically, when the I-V characteristic (voltage-current change) of the resistance change type memory element A is drawn with, for example, a 0-side set as a starting point and the I-V characteristic (voltage-current change) of the MIS transistor T is drawn with, for example, a V-side set as a starting point, a cross point of those I-V characteristic (voltage-current change) curves becomes the operating point. In addition, on the contrary, when the I-V characteristic (voltage-current change) of the MIS transistor T is drawn with the 0-side set as the starting point and the I-V characteristic (voltage-current change) of the resistance change type memory element A is drawn with the V-side set as the starting point, the operating point can be obtained as well.

Next, when performing the recording (erasure) of information by making the polarity of the applied voltage V reversed, due to a reason that the resistance value of the memory element A is low the applied voltage V is set such that the voltage VA applied between the both ends of the memory element A may become larger than the erasure threshold voltage of the memory element A.

When the voltage VA applied between the both ends of the memory element A is larger than the erasure threshold voltage of the memory element A, the recording (erasure) of information starts and the resistance value of the memory element A increases. Since the divided voltage to the memory element A, that is, the voltage VA applied between the both ends of the memory element A also increases along with the increase of the resistance value of the memory element A, the resistance value of the memory element A further increases. When the resistance value of the memory element A becomes large (high resistance) to some extent, the resistance value does not increase any further, so that the recording operation (erasing operation) of information stops at this point.

Similarly to the above described operating point, the voltages at the both ends of each of the elements A and T and the current which flows in the memory cell C in this state can also be obtained from both the I-V characteristic of the memory element A and the I-V characteristic of the MIS transistor T.

By thus applying the voltage V to the both ends of the memory cell C, the recording of information, that is, the writing or the erasure can be performed on the memory element A of that memory cell C.

In the explanation with respect to the above described recording of information, since the recording of information is performed using two states of: the state where resistance value of the memory element A is high and the state where resistance value of the memory element A is low, the recording of information of two values (1-bit) such as data "0" and the data "1" can be performed, for example.

In the memory device of this embodiment, the application thereof is performed, so that the multi-value recording of three values, 4 values (2-bit) or more can be performed.

Hereunder, an explanation is made with respect to the multi-value recording according to this embodiment.

With respect to the MIS transistor T, the on-resistance changes depending on the magnitude of the gate voltage VGS applied to the gate, and the I-V characteristic also changes.

Therefore, the gate voltage VGS of the MIS transistor T in the memory cell C is altered to change the I-V characteristic of the MIS transistor T, so that a position of the operating point can be altered.

Figure 4:
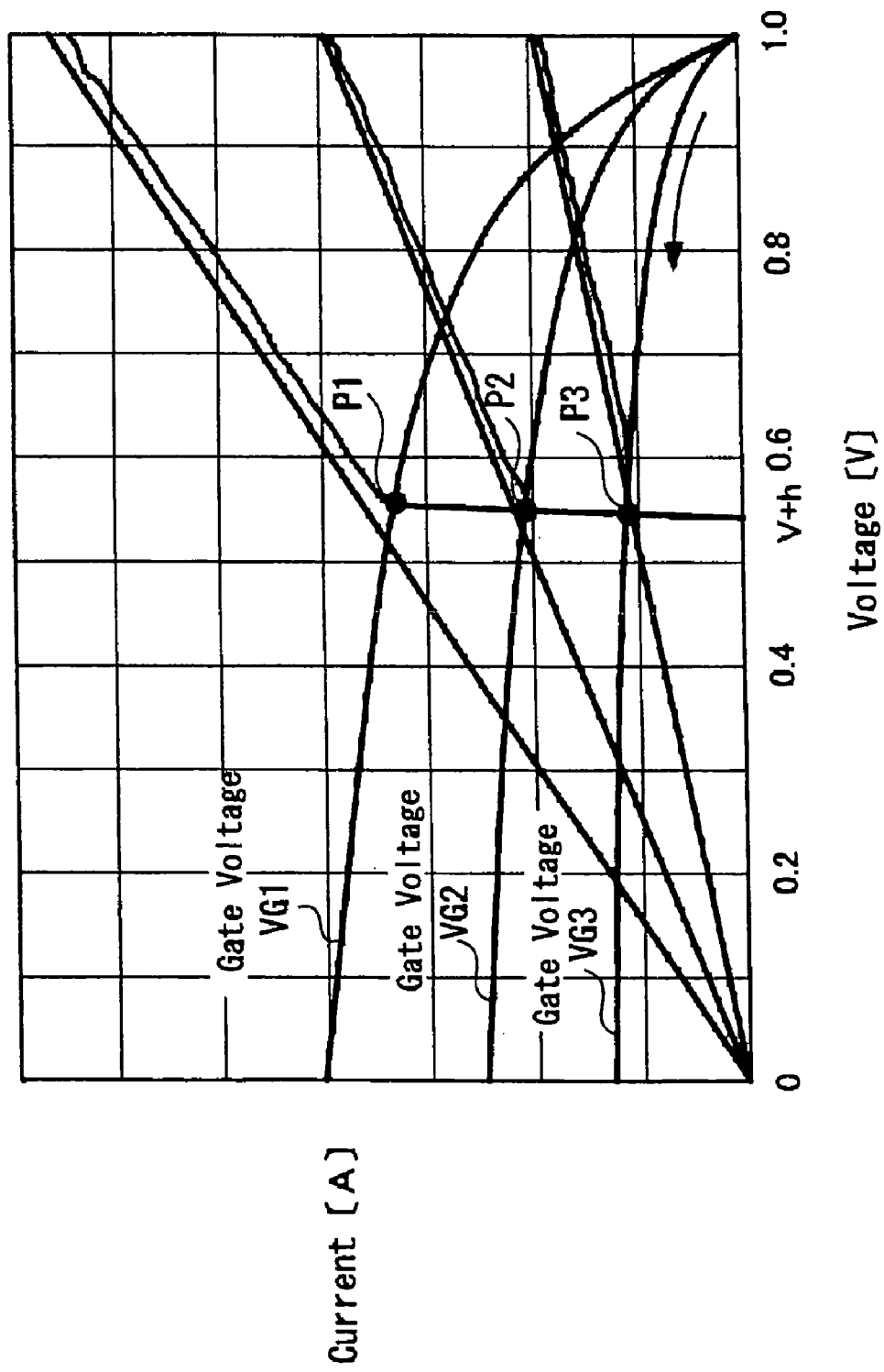
FIG. 4 is a diagram explaining a change of an operating point when a gate voltage of an MIS transistor in FIG. 2 is altered.

Specifically, as shown in FIG. 4, the I-V characteristic of the MIS transistor T changes when altering the gate voltage VGS of the MIS transistor T to VG1, VG2 and VG3 (VG1>VG2>VG3). The larger the gate voltage VGS of the MIS transistor T is, the more the current flows and the lower the on-resistance becomes, and therefore the I-V characteristic curve shifts to the upper position in FIG. 4.

Further, when the gate voltage VGS of the MIS transistor T is changed to VG1, VG2 and VG3, the operating point also becomes different points of P1, P2 and P3 respectively, and also the resistance value of the memory element A at the operating point becomes different.

Further, for example, each of the operating points P1, P2 and P3 is assigned respectively to "11", "10" and "01" which are 2-bit information, and the state of high resistance (before writing and after erasing) is assigned to "00", so that the 2-bit information can be stored in the memory element A.

Thus, the multi-value recording can be obtained by assigning a plurality of bit information items to the resistance value of the element in which the writing is performed.

Note that, since difference in characteristic may somewhat exist in the MIS transistor T of each memory cell C in an actual memory device, not only the operating points P1, P2 and P3 shown in FIG. 4, but also range having some extent of width (range of the resistance value of the memory element A) in the vicinity of each of operating points P1, P2 and P3 is assigned to the respective information (for example, each data of "01", "10" and "11") in consideration of such difference.

For example, when the resistance value of the memory element A is 3 kΩ or less, that is assigned to "11" of the 2-bit information, when the resistance value of the memory element A is 3 kΩ to 6 kΩ, that is assigned to "10", when the resistance value of the memory element A is 6 kΩ to 9 kΩ, that is assigned to "01" and when the resistance value of the memory element A is 9 kΩ or more, that is assigned to "00".

Similarly, 3-bit information (8 values) and 4-bit information (16 values) can also be recorded by further dividing the range of the resistance value.

When reading the information recorded on the memory element A to which the multi-value recording is performed as described above, current for read-out flows in the memory cell C, and since this current flows in proportion to the resistance value of the memory element A, the resistance value of the memory element A is detected to obtain contents of information.

However, when performing the read-out, the resistance value of the memory element A must be prevented from decreasing.

Therefore, a comparatively high voltage which is a power source voltage $V_{DD}$, for example, is applied to the gate of the MIS transistor when performing the read-out. Accordingly, since the on-resistance of the MIS transistor T becomes small, the voltage VA applied between the both ends of the memory element A becomes small when the current for read-out flows, so that the resistance value of the memory element A is prevented from decreasing.

Moreover, it can also be considered that the voltage applied to the both ends of the memory cell C when performing the read-out, for example, is made smaller than the voltage applied to the both ends of the memory cell C when writing at the operating point corresponding to the recording of that information; however, the method of applying the power source voltage to the gate voltage as described above excels in the point that the voltage can be controlled more easily with the method.

Further, when the memory element A makes a transition from the state of low resistance to the state of high resistance, in other words, when performing the erasure, it is also desirable to make the gate voltage $V_{GS}$ of the MIS transistor T into a relatively high voltage which is the power source voltage $V_{DD}$, for example. As a result, since the on-resistance of the MIS transistor T becomes small, the voltage VA applied between the both ends of the memory element A can be larger than the erasure threshold value without making the voltage V applied to the both ends of the memory cell C large.

Accordingly, since the erasure can be performed with applying a comparatively small voltage V, the voltage V applied to the memory cell C, which is required for erasure, can be lowered to reduce a load on the wiring or the element.

Figure 5:
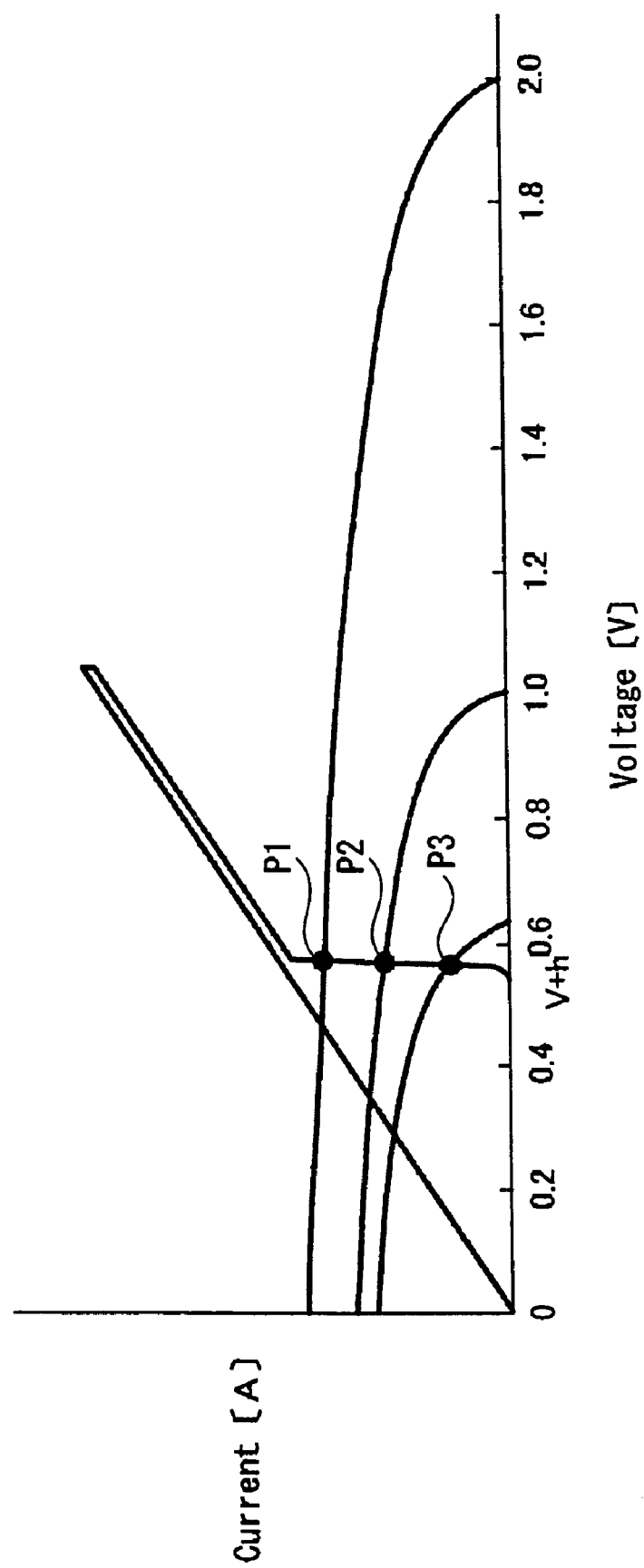
FIG. 5 is a diagram explaining a change of the operating point when a voltage applied to both ends of the memory cell in FIG. 2 is altered.

Further, as shown in FIG. 5, if the voltage V applied to the both ends of the memory cell C is changed, the operating point can be altered similarly to perform the multi-value recording.

In FIG. 5, the operating point is made to vary into P1, P2 and P3 by changing the voltage V applied to the both ends of the memory cell C into 2.0 V, 1.0 V and 0.65 V respectively.

Further, it is also possible to alter both the gate voltage $V_{GS}$ of the MIS transistor T and the voltage V applied to the both ends of the memory cell C.

Even in this manner, the multi-value recording can be performed. This structure is suitable when it is difficult to change greatly (in a wide range) the voltage V applied to the both ends of the memory cell C, for example.

Further, according to this embodiment, since the memory element A has the I-V characteristic shown in FIG. 1, the resistance value of the memory element A becomes low by changing the gate voltage $V_{GS}$ or the voltage V applied to the memory cell C in the direction of making the resistance value of the memory element A lower, so that a direct transition can be made between the operating points such as making a transition from P2 to P1 in FIG. 4.

On the other hand, the resistance value of the memory element A does not become high in the direction of making the resistance value of the memory element A higher (for example, the transition from P1 to P2 in FIG. 4) even if the gate voltage $V_{GS}$ or the voltage V applied to the memory cell C is changed, and therefore no direct transition can be made between the operating points.

Then, the transition from the state of low resistance (Ohmic characteristic) to the state of high resistance is made by once applying a voltage of reverse polarity, and thereafter the transition is made further to a desired resistance value. In this case, although two stages of transition are required, the recording of information can be performed in sufficiently a short period of time in comparison to that of the memory device having such structure that the resistance value is decided by the number of pulses.

According to the above described memory device 100 of this embodiment, the memory cell is formed of the resistance change type memory element A and the MIS transistor T connected in series, and the operating point is changed by altering the gate voltage $V_{GS}$ of the MIS transistor T or the voltage V applied to the both ends of the memory cell C to control the resistance value of the memory element A after the recording (writing or erasing) of information in a plurality of levels (points or range sets), so that the recording of information of three values or more, which means the multi-value recording, can be performed on the memory element A.

Further, According to the memory device of this embodiment, the resistance value of the memory element A after the recording of information can be changed only by altering the gate voltage $V_{GS}$ of the MIS transistor T or the voltage V applied to the both ends of the memory cell C, so that even in case of performing the multi-value recording, a voltage pulse and a current pulse of only one clock is required and there is no need to control the pulse width or the number of pulses.

Accordingly, the multi-value recording can be performed in a short period of time.

Furthermore, according to the memory device of this embodiment, since the MIS transistor T provided in the memory cell C for access in order to select a memory cell C is used as the circuit element for controlling the operating point of the memory cell C, the multi-value information recording can be performed without further adding a circuit element in the memory cell C.

In other words, the multi-value recording can be performed with a simple configuration according to the memory device of this embodiment.

Furthermore, according to the memory device of this embodiment, the word line W is as shown in FIG. 3 connected in common to the gates of the MIS transistors in the memory cells C of each row and this word line W is connected to the row decoder RD.

Due to the above, the gate voltage $V_{GS}$ of the MIS transistor T in the memory cell C can be controlled with the simple configuration by connecting a circuit which performs a potential control of the word line W to this row decoder RD or by incorporating the circuit which performs the potential control of the word line W in the row decoder RD.

Further, as described above, the I-V characteristic and on-resistance of the MIS transistor T are changed by altering the gate voltage $V_{GS}$ of the MIS transistor T in the memory cell C, thereby altering the operating point to perform the multi-value recording.

In other words, according to the memory device of this embodiment the multi-value recording can be performed with the simple configuration by controlling the gate voltage $V_{GS}$ of the MIS transistor T in the memory cell C.

Moreover, since the potential of the word line W can be constant by thus providing the row decoder RD with the circuit which performs the potential control of the word line W, the memory cells of the same row can be read collectively.

Figure 6A:
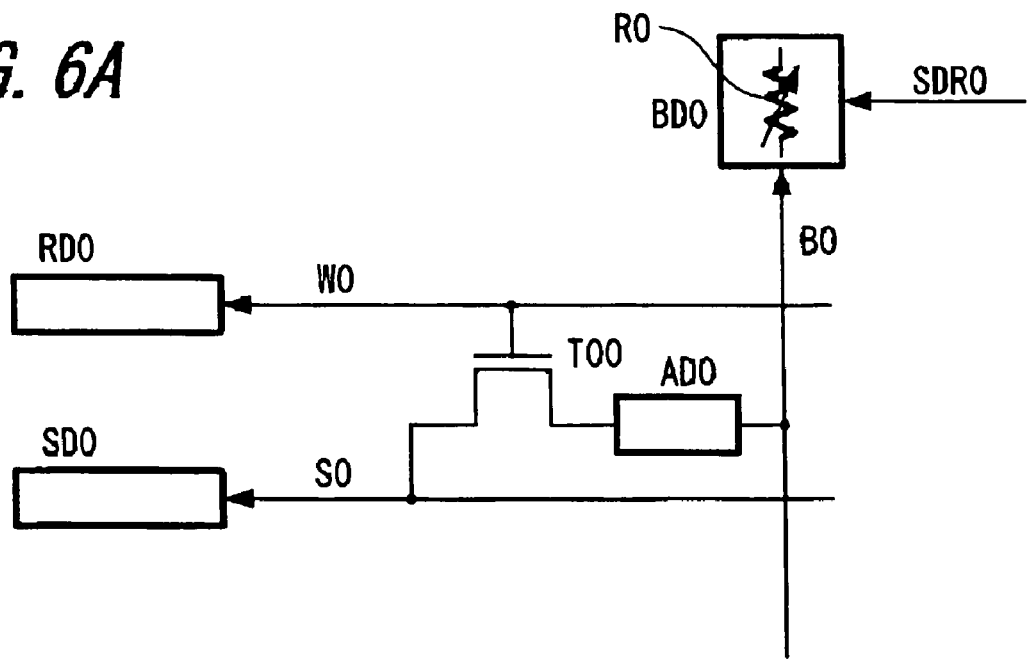
FIG. 6A is an electric circuit diagram of the memory device when a resistance value of a bit decoder is controlled.

Moreover, in order to alter the voltage V applied to the both ends of the memory cell C as shown in FIG. 5, a structure is only required in which, as shown in an electric circuit diagram of FIG. 6A, a decoder resistance control signal SDR0 is supplied to the bit decoder BD0 to control a resistance value of a variable resistance element R0 or of a switching element in the bit decoder BD0 by this decoder resistance control signal SDR0, for example. The variable resistance element R0 or the switching element in the bit decoder BD0 also becomes a load resistance as well as the MIS transistor T00 with respect to a memory element A00.

Further, since the bit decoder BD0 is normally provided with the variable resistance element R0 or the switching element inside, the voltage V applied to the both ends of the memory cell C can be altered with the simple configuration without adding a new structure.

Note that, it is similarly possible to control the voltage V applied to the both ends of the memory cell C by providing a circuit which performs the potential control of the source line S with respect to the source decoder SD which selects a specific source line S from the source lines S connected in common to the memory cells C in the direction of row, or by controlling the resistance value of the variable resistance element or of the switching element in the source decoder SD.

Figure 6B:
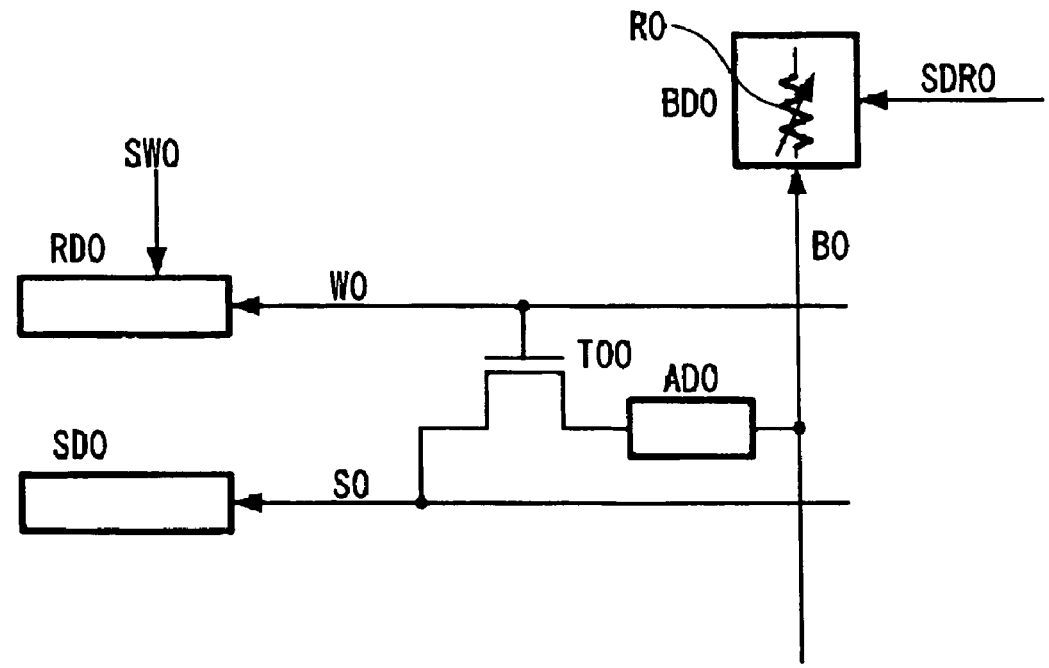
FIG. 6B is an electric circuit diagram of the memory device when the resistance value of the bit decoder and a potential of a word line are controlled.

Moreover, when altering both the gate voltage $V_{GS}$ of the MIS transistor T and the voltage V applied to the both ends of the memory cell C, a structure is only required in which, as shown in an electric circuit diagram of FIG. 6B, the decoder resistance control signal SDR0 is supplied to the bit decoder BD0 similarly to the case of FIG. 6A and also, for example, a signal SW0 which controls the potential of the word line W0 is supplied to the row decoder RD0 from a circuit (not shown) which performs a potential control of the word line W0 connected to the row decoder RD0, to control the gate voltage $V_{GS}$ of the MIS transistor T. As an alternative, the circuit to perform the potential control of the word line W0 may be incorporated in the row decoder RD0.

Note that, for the convenience of a simplified diagram, the structure of only one memory cell is shown in each electric circuit diagram of FIGS. 6A and 6B, however the memory cells of other rows or other columns are also structured in the same manner.

Therefore, according to this embodiment, the memory device which has the simple configuration and which perform the multi-value recording can be obtained.

[Practice Example]

In the following, a memory cell in the memory device was actually produced and the multi-value recording has been performed.

The memory cell C including the memory element A and the MIS transistor T connected in series has been produced as shown in the circuit diagram of FIG. 2.

Then, similarly to those shown in FIG. 4, with the constant (1.0 volt) voltage applied to the both ends of the memory cell C, the gate voltage $V_{GS}$ of the MIS transistor T has been changed into four values (0.74 V, 0.76 V, 0.80 V and 1.20 V), and the memory element A has made a transition from the state of high resistance to the state of low resistance under respective conditions to perform writing on this memory cell C.

As a result, four operating points corresponding to the value of each gate voltage $V_{GS}$ have been obtained.

Further, the resistance value (resistance value after writing) of the memory element A and the on-resistance value of the MIS transistor T have been measured respectively at each operating point.

Figure 7A:
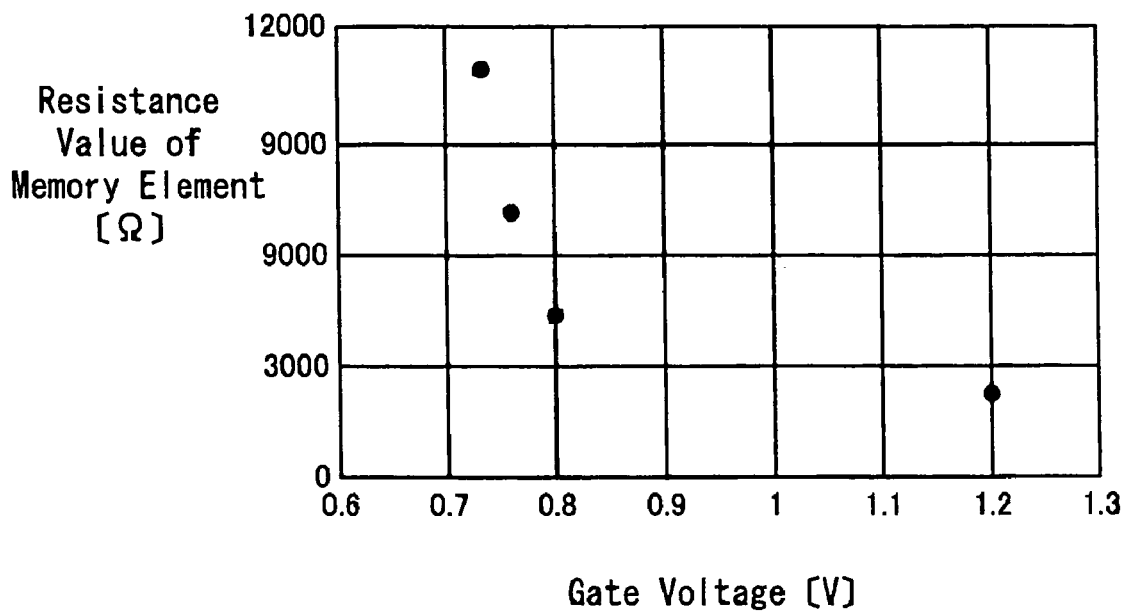
FIG. 7A is a diagram showing a relation between the gate voltage of the MIS transistor and a resistance value of a memory element at the operating point.

A relation between the gate voltage $V_{GS}$ of the MIS transistor T and the resistance value of the memory element A is shown in FIG. 7A.

It can be understood from FIG. 7A that the resistance value of the memory element A falls in accordance with an increase in the gate voltage $V_{GS}$ of the MIS transistor T.

Figure 7B:
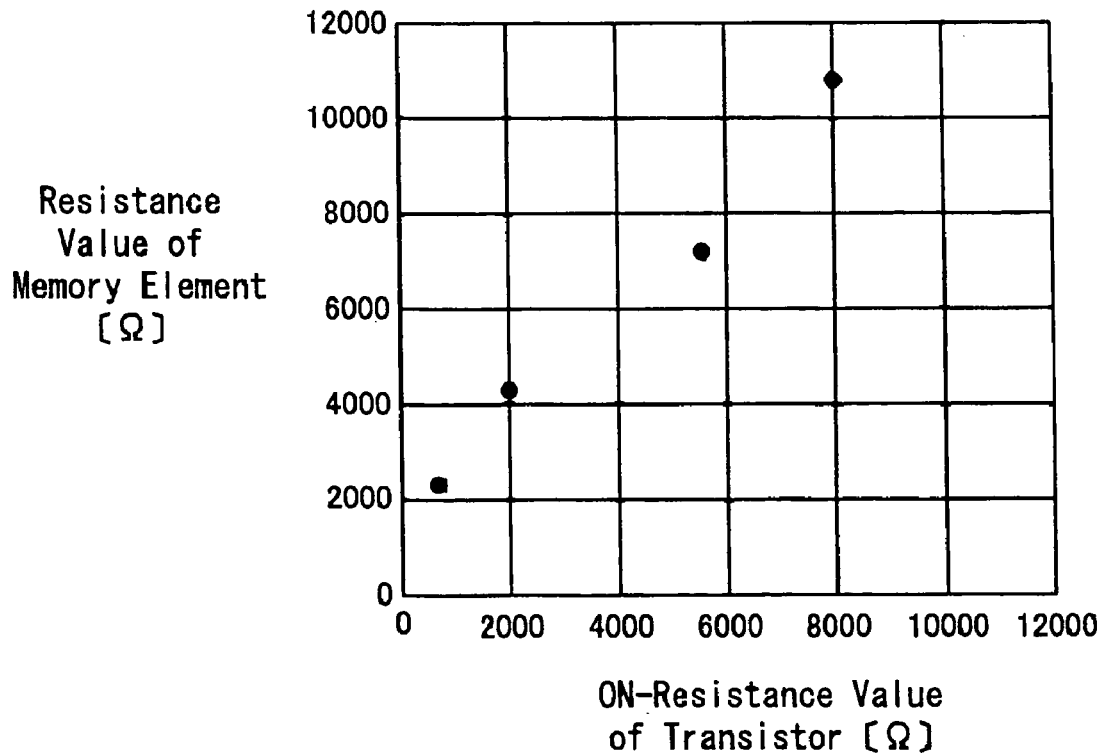
FIG. 7B is a diagram showing a relation between an on-resistance value of the MIS transistor at the operating point and the resistance value of the memory element.

Further, a relation between the on-resistance value of the MIS transistor T and the resistance value (resistance value after writing) of the memory element A is shown in FIG. 7B.

It can be understood from FIG. 7B that the larger the on-resistance value of the MIS transistor T is, the larger the resistance value of the memory element A after recording becomes.

Note that though in the above described embodiment the memory cell C is formed of the MIS transistor T connected in series to the memory element A, in the present invention the circuit element connected in series to the memory element is not limited to the MIS transistor.

It is also possible to use a bipolar transistor, for example, as the circuit element connected to the memory cell in series. In that case the multi-value recording can also be performed by altering a base current of the bipolar transistor or the voltage applied to the both ends of the memory cell.

Further, it is also possible to use an active element such as a diode or a resistance element, for example, as the circuit element connected to the memory element in series.

When such diode or resistance element is used, the multi-value recording can be performed by altering the voltage applied to the both ends of the memory cell.

In addition, when the active element such as the transistor or the diode is used as the circuit element connected to the memory element in series, the selection of memory cell can be performed using the active element.

In the above stated embodiment, although the memory element A is structured to have the I-V characteristic shown in FIG. 1, the structure of the memory element constituting the memory cell is not limited to a memory element which has a characteristic of similar tendency to the I-V characteristic shown in FIG. 1 according to the present invention; but a resistance change type memory element in general can be used as well.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A memory device, comprising:
   a memory cell including:
   a memory element which stores information according to a state of electric resistance, and
   a circuit element as a load connected in series to said memory element;
   wherein:
   an operation to change said memory element from a state of high resistance value to a state of low resistance value is defined as writing, and an operation to change said memory element from a state of low resistance value to a state of high resistance value is defined as erasing,
   a resistance value of said memory element after said writing is set to a plurality of different levels by controlling a voltage or current which is applied to said circuit element or to said memory element at a time of said writing,
   in said memory element, different information is assigned to each of said plurality of levels in the state of low resistance value and to the state of high resistance value after said erasing, and
   information of three values or more can be stored respectively in said memory element in said memory cell,
   wherein:
   said circuit element comprises a MIS transistor,
   access to said memory element in said memory cell is controlled by said MIS transistor, and
   a gate voltage applied to a gate of said MIS transistor is controlled at the time of said writing, so that a resistance value of said memory element after said writing is set to said plurality of different levels.

2. The memory device according to claim 1, wherein:
   when reading information recorded in said memory element, a power source voltage is applied to said gate to judge a state of resistance value of said memory element.

3. The memory device according to claim 2, wherein:
   the power source voltage is applied to said gate at a time of said erasing.

4. The memory device according to claim 1, wherein:
   said memory cell is disposed in a matrix shape,
   wiring is connected in common to said gates of said memory cells disposed in a row direction,
   selection means for selecting specific wiring from said wiring connected to each row of said memory cells is provided, and
   a potential control circuit of said wiring is connected to said selection means or said selection means includes the potential control circuit of said wiring.

5. A memory device, comprising:
   a memory cell including:

a memory element which stores information according to a state of electric resistance, and a circuit element as a load connected in series to said memory element;

wherein:

an operation to change said memory element from a state of high resistance value to a state of low resistance value is defined as writing, and an operation to change said memory element from a state of low resistance value to a state of high resistance value is defined as erasing, a resistance value of said memory element after said writing is set to a plurality of different levels by controlling a voltage or current which is applied to said circuit element or to said memory element at a time of said writing, in said memory element, different information is assigned to each of said plurality of levels in the state of low resistance value and to the state of high resistance value after said erasing, and information of three values or more can be stored respectively in said memory element in said memory cell, wherein:

said circuit element comprises a MIS transistor, access to said memory element in said memory cell is controlled by said MIS transistor, and a voltage or current which is applied to source-drain of said MIS transistor or to said memory element is controlled at the time of said writing, so that a resistance value of said memory element after said writing is set to said plurality of different levels.

6. The memory device according to claim 5, wherein:

said memory cell is disposed in a matrix shape, selection means for selecting specific wiring from wiring connected in common to said memory cell disposed in a row direction or to said memory cell disposed in a column direction is provided, and the voltage or the current which is applied to the source-drain of said MIS transistor or to said memory element is controlled by changing a resistance value of a switching element or a variable resistance element in said selection means.

7. The memory device according to claim 6, further comprising second selection means for selecting specific second wiring from second wiring connected in common to a gate of said memory cell disposed in the row direction, wherein:

a potential control circuit of said second wiring is connected to said second selection means or said second selection means includes the potential control circuit of said second wiring.

* * * * *